US011081594B2

(12) United States Patent
Choi et al.

(10) Patent No.: US 11,081,594 B2
(45) Date of Patent: Aug. 3, 2021

(54) THIN FILM TRANSISTOR AND DISPLAY PANEL USING THE SAME

(71) Applicant: LG DISPLAY CO., LTD., Seoul (KR)

(72) Inventors: Sunyoung Choi, Paju-si (KR); Kummi Oh, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/711,049

(22) Filed: Dec. 11, 2019

(65) Prior Publication Data

US 2020/0203535 A1 Jun. 25, 2020

(30) Foreign Application Priority Data

Dec. 20, 2018 (KR) .................. 10-2018-0166067

(51) Int. Cl.
*H01L 29/786* (2006.01)
*H01L 25/075* (2006.01)
*H01L 27/12* (2006.01)

(52) U.S. Cl.
CPC .... *H01L 29/78696* (2013.01); *H01L 25/0753* (2013.01); *H01L 27/1214* (2013.01); *H01L 29/78648* (2013.01)

(58) Field of Classification Search
CPC ......... H01L 29/78696; H01L 29/78648; H01L 25/0753; H01L 27/1214
USPC ........................................................ 257/89
See application file for complete search history.

(56) References Cited

U.S. PATENT DOCUMENTS

| 2004/0246765 | A1* | 12/2004 | Kato | G11C 11/404 |
| | | | | 365/149 |
| 2015/0108481 | A1* | 4/2015 | Khang | H01L 29/78645 |
| | | | | 257/59 |
| 2015/0255449 | A1* | 9/2015 | Kim | G09G 3/3648 |
| | | | | 349/40 |
| 2018/0342492 | A1* | 11/2018 | Lu | H01L 33/36 |

FOREIGN PATENT DOCUMENTS

| KR | 10-2010-0055194 A | 5/2010 |
| KR | 10-2012-0004786 A | 1/2012 |
| KR | 10-2015-0051824 A | 1/2012 |

* cited by examiner

*Primary Examiner* — Tong-Ho Kim
(74) *Attorney, Agent, or Firm* — Birch, Stewart, Kolasch & Birch LLP

(57) ABSTRACT

In a display panel according to the disclosure, the display panel includes a substrate, an active layer having a source region, a drain region and a channel region on the substrate, a source electrode contacted with the source region, a drain electrode contacted with the drain region, an upper gate electrode above the active layer, and a lower gate electrode below the active layer. An edge of the lower gate electrode closest to the drain region overlaps with the channel region, and the source region and the drain region do not overlap with the upper gate electrode. The driving element constituting the display panel can generate a high driving current without deteriorating the characteristics thereof, thereby stably maintaining the luminance of the display panel.

12 Claims, 9 Drawing Sheets

THIN FILM TRANSISTOR AND DISPLAY PANEL USING THE SAME

CROSS-REFERENCE TO RELATED APPLICATION

The disclosure claims the priority benefit of Korean Patent Application No. 10-2018-0166067 filed on Dec. 20, 2018 in the Republic of Korea, the entire contents of which is incorporated herein by reference in its entirety.

BACKGROUND

Technical Field

The disclosure relates to a thin film transistor, and more particularly, to a thin film transistor capable of generating a high driving current and a display panel using the thin film transistor.

Discussion of the Related Art

Liquid crystal display devices (LCDs), organic light emitting display devices (OLEDs), and quantum dot display devices (QDs) widely used up to now are gradually increasing in their application range.

In order to implement an image, the above-described display devices are provided with a plurality of light emitting elements and driving elements for supplying a driving signal or a driving current to each light emitting element so that the light emitting element can emit light individually. The plurality of light emitting elements and the driving elements are arranged on a substrate. The display devices interpret the plurality of light emitting elements arranged on the substrate in accordance with arrangement of information to be displayed and then indicate it on the substrate.

Since the liquid crystal display device is not a self-emitting type, a backlight unit arranged to emit light on a rear surface of the liquid crystal display device is required. A backlight unit increases a thickness of the liquid crystal display device, has limitations in implementing the liquid crystal display device in various forms of designs such as flexible or circular, and may degrade luminance and response speed.

On the other hand, display devices having self-emitting elements can be realized to be thinner than display devices having light sources. Thus, it is possible to implement flexible and foldable display devices. As the display devices having the self-emitting elements, there are organic light-emitting display devices including organic material as light-emitting layers, LED display devices using LEDs (Light Emitting Diodes) and so on. It is not necessary to have separate light sources for the organic light emitting display devices or the LED display devices, so that they can be utilized as display devices having thinner or various shapes.

However, in the organic light emitting display devices using organic materials, pixels can become defective due to the oxidation phenomenon which may occur between organic light emitting layers and electrodes because of the penetration of moisture and oxygen. Accordingly, various technical constructions are additionally needed to minimize any penetration of oxygen and moisture.

In order to address the above-mentioned limitations, research and development on display devices using LEDs having inorganic material as the light emitting elements have been in progress in recent years. Since such light emitting display devices have high image quality and high reliability, it is in the spotlight as next generation display devices.

An LED element is a semiconductor light emitting element that uses a property of emitting light when current is applied to the semiconductor, and is widely used for various display devices such as illumination devices, TVs, signage display devices, and tiling display devices. The LED element includes an n-type electrode, a p-type electrode, and an active layer therebetween. The n-type electrode and the p-type electrode are formed of a semiconductor, respectively. Electrons from the n-type electrode and holes from the p-type electrode are combined in the active layer to emit light when electric current is supplied to the n-type electrode and the p-type electrode.

The LED element is made of a compound semiconductor such as GaN. Accordingly, a high current can be injected into the LED element according to the characteristics of an inorganic material, thereby realizing a high luminance. Also, the LED element has high reliability because of low environmental impact for heat, moisture, oxygen and so on.

Further, since an internal quantum efficiency of the LED element is about 90% which is higher than that of the organic light emitting display device, it is possible to display a high-brightness image and realize a display device with low power consumption.

Further, the LED element uses an inorganic material unlike the organic light emitting display device. Therefore, there is no need for a separate sealing film or sealing substrate to minimize the penetration of oxygen and moisture because it is hardly affected by oxygen and moisture. Accordingly, there is an advantage that a non-display area of the display device can be reduced because a margin area that can be generated by disposing the sealing film or the sealing substrate is unnecessary.

However, a light emitting element such as the LED element requires a relatively high driving current in comparison with the liquid crystal display device or the organic light emitting display device. The pixel driving circuit includes a driving element for providing a constant current to the light emitting element. The light emitting element emits light by receiving the driving current from the pixel driving circuit connected to the light emitting element.

In order to generate the high driving current, it is possible to modify an active layer form of the driving element. In general, the driving current can be increased by forming the width of the active area to be larger than the length of the active area. In this case, the length of the active area is a numerical value indicating a moving distance of the direction in which the carrier moves. The carrier moves from the source region of the active area to the drain region of the active area. The width of the active area can preferably mean a width of an area/path on which the carrier moves. Specifically, the length and width of the active area can mean the length and width of a channel region in which the carrier moves.

When the width of the active area is formed larger than the length of the active area, the characteristics of the driving element are lowered than when the width of the active area is smaller than the length of the active area. If the width of the active area is longer than the length of the active area, factors that degrade the characteristics of the driving element such as hump and DIBL (Drain Induced Barrier Lowering) is generated in IV curve (transfer curve or Ids-Vgs curve) of a transistor. Also, there is a problem that the driving current does not saturate but increases in the saturation region in measurement of the driving current curve (output curve or Ids-Vd curve). The LED element is needed to maintain a stable current value as the current device. However, when the driving device having the width of the active area larger than the length of the active area is used, the LED element is not easy to maintain a stable luminance.

SUMMARY

The inventors of the disclosure have recognized a problem described above, and invented a driving element which provides a stable current while generating a high driving current and a display panel using the driving element.

An object of the disclosure is to provide a thin film transistor implemented with an electrode-specific structure capable of improving output characteristics while generating a high driving current.

Another object of the disclosure is to provide a thin film transistor capable of providing a high driving current by applying a current control structure with a top gate and a lower gate of a driving element for providing a driving current to an LED element, and a display panel using the driving element.

The objects of the disclosure are not limited to the above-mentioned objects, and other objects not mentioned can be clearly understood by those skilled in the art from the following description.

In a display panel according to an embodiment of the disclosure, the display panel includes a substrate, an active layer having a source region, a drain region and a channel region on the substrate, a source electrode contacted with the source region, a drain electrode contacted with the drain region, an upper gate electrode above the active layer, and a lower gate electrode below the active layer. In this case, the edge of the lower gate electrode closest to the drain region overlaps with the channel region, and the source region and the drain region do not overlap with the upper gate electrode. Therefore, the driving element constituting the display panel can generate a high driving current without deteriorating the characteristics thereof, thereby stably maintaining the luminance of the display panel.

In a thin film transistor according to an embodiment of the disclosure, the thin film transistor includes an active layer including a source region, a drain region and a channel region, an upper gate electrode above the active layer, and a lower gate electrode below the active layer. In this case, the length of the lower gate electrode is shorter than the length of the upper gate electrode, and the source region and the drain region do not overlap with the upper gate electrode. Therefore, the thin film transistor can improve the characteristics of the thin film transistor while generating a high driving current.

According to embodiments of the disclosure, it is possible to stably maintain the luminance of the display panel by providing a high driving current to the light emitting element because the display panel includes the thin film transistor with the mentioned above electrode-specific structure.

According to embodiments of the disclosure, it is possible to improve the electrical characteristics of the thin film transistor by reducing the occurrence of factors that degrade the electrical characteristics of the thin film transistor such as a kink, a hump or a DIBL (Drain Induced Barrier Lowering) because the thin film transistor in which the edge of the lower gate electrode closest to the drain overlaps with the channel region, and the source region and the drain region do not overlap with the upper gate electrode can be implemented.

According to embodiments of the disclosure, it is possible to improve the electrical characteristics of the thin film transistor by reducing the occurrence of factors that degrade the electrical characteristics of the thin film transistor such as a kink, a hump or a DIBL while generating a high driving current because the length of the lower gate electrode of the thin film transistor is less than the length of the upper gate electrode but is more than half thereof.

According to embodiments of the disclosure, it is possible to allow the carrier to move through the channel region because the upper gate electrode of the thin film transistor completely covers the channel region of the active layer.

According to embodiments of the disclosure, it is possible to prevent a step coverage from being generated in the channel region of the active layer, and the characteristics of the thin film transistor from being deteriorated because the width of the lower gate electrode of the thin film transistor is equal to or longer than the width of the active layer.

According to embodiments of the disclosure, it is possible to provide a high driving current to the light emitting element because the width of the channel region of the thin film transistor is longer than the length of the channel region.

According to embodiments of the disclosure, it is possible to increase a width of data voltage to represent more subdivided gradations because the thin film transistor has a S-factor of 0.3 or more.

The details of other embodiments are included in the detailed description and the drawings of the disclosure.

BRIEF DESCRIPTION OF DRAWINGS

The accompanying drawings, which are included to provide a further understanding of the disclosure and are incorporated and constitute a part of the disclosure, illustrate embodiments of the disclosure and together with the description serve to explain various principles. In the drawings.

DETAILED DESCRIPTION

Figure 1:
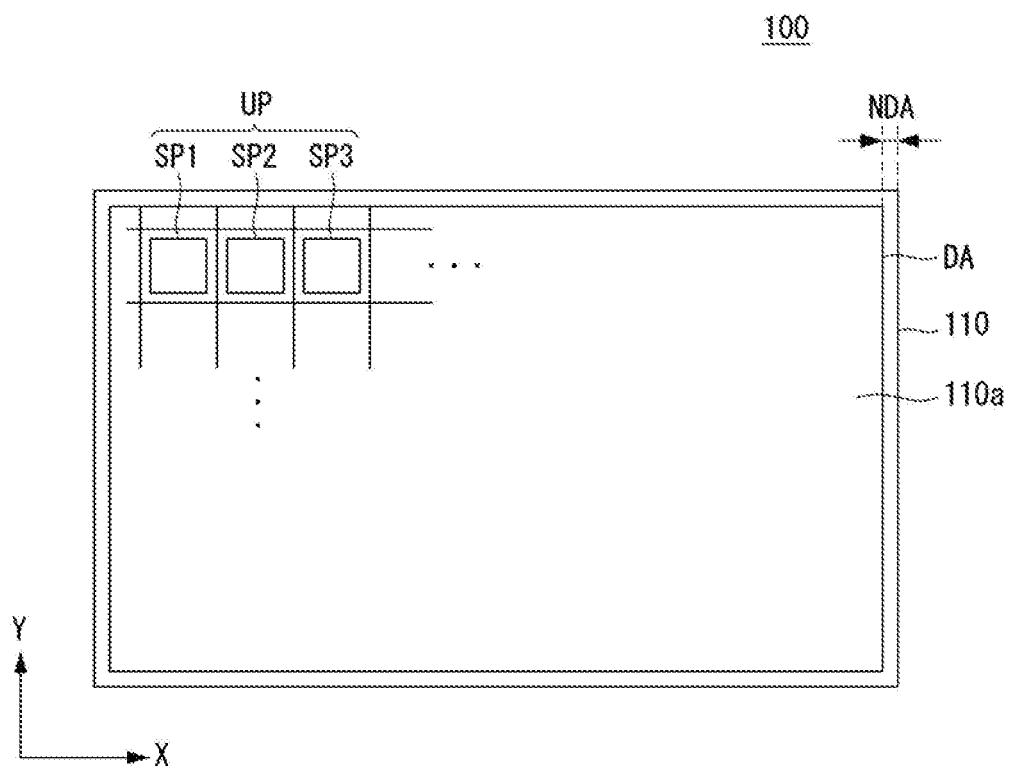
FIG. 1 is a plan view illustrating a display device according to an embodiment of the disclosure.

Various aspects and features of the disclosure and methods of accomplishing them can be understood more readily by reference to the following detailed descriptions of exemplary aspects and the accompanying drawings. The disclosure may, however, be embodied in many different forms and should not be construed as being limited to the exemplary aspects set forth herein. Rather, these exemplary aspects are provided so that this disclosure will be thorough and complete and will fully convey the concept of the disclosure to those skilled in the art, and the disclosure is defined by the appended claims.

The shapes, sizes, proportions, angles, numbers, etc. shown in the figures to describe the exemplary aspects of the disclosure are merely examples and not limited to those shown in the figures. Like reference numerals denote like elements throughout the specification. In describing the disclosure, detailed descriptions of related well-known technologies will be omitted to avoid unnecessary obscuring the disclosure. When the terms 'comprise', 'have', 'consist of' and the like are used, other parts can be added as long as the term 'only' is not used. The singular forms can be interpreted as the plural forms unless explicitly stated.

The elements call be interpreted to include an error margin even if not explicitly stated When the position relation between two parts is described using the terms "on", "over", "under", "next to" and the like, one or more parts can be positioned between the two parts as long as the term "immediately" or "directly" is not used.

It will be understood that, although the terms "first", "second", etc. can be used herein to describe various elements, these elements are not limited by these terms. These terms are used to distinguish one element from another element. The terms and names of elements used herein are chosen for ease of description and can be different from the names of parts used in actual products.

The features of various exemplary aspects of the disclosure can be coupled or combined with one another either partly or wholly, and can technically interact or work together in various ways. The exemplary aspects can be carried out independently or in connection with one another.

In the disclosure, a gate driver and a pixel driving circuit formed on a substrate of a display panel can be implemented by n-type or p-type transistors. For example, the transistor can be implemented as a transistor of a metal oxide semiconductor field effect transistor (MOSFET) structure. The transistor is a three-electrode element including a gate electrode, a source electrode, and a drain electrode. The source electrode supplies carriers to the transistor. The carriers begin to move away from the source electrode in the transistor. The drain electrode is an electrode from which the carriers exit outside the transistor.

For example, in the transistor, the carriers move from the source electrode to the drain electrode. In the case of an n-type transistor, since the carriers are electrons, the voltage of the source electrode has a voltage lower than the voltage of the drain electrode so as to move from the source electrode to the drain electrode. In the n-type transistor, since electrons move from the source electrode toward the drain electrode, the current flows inversely from the drain electrode toward the source electrode. In the case of a p-type transistor, since the carriers are holes, the voltage of the source electrode is higher than the voltage of the drain electrode so that holes can move from the source electrode to the drain electrode. Since the holes of the p-type transistor move from the source electrode to the drain electrode, the current flows from the source electrode to the drain electrode. The source electrode and the drain electrode of the transistor are not fixed, but can be changed in accordance with an applied voltage. Therefore, the source electrode and the drain electrode can be referred to as a first electrode and a second electrode or a second electrode and a first electrode, respectively.

Hereinafter, a gate-on voltage is a voltage of a gate signal that the transistor can be turned-on, and a gate-off voltage is a voltage of the gate signal the transistor can be turned-off. For example, in the p-type transistor, the gate-on voltage can be a logic low voltage VL and the gate-off voltage can be a logic high voltage VH. In the n-type transistor, the gate-on voltage can be a logic high voltage and the gate-off voltage can be a logic low voltage.

Hereinafter, a thin film transistor and a display panel according to embodiments of the disclosure will be described with reference to the accompanying drawings.

Figure 2:
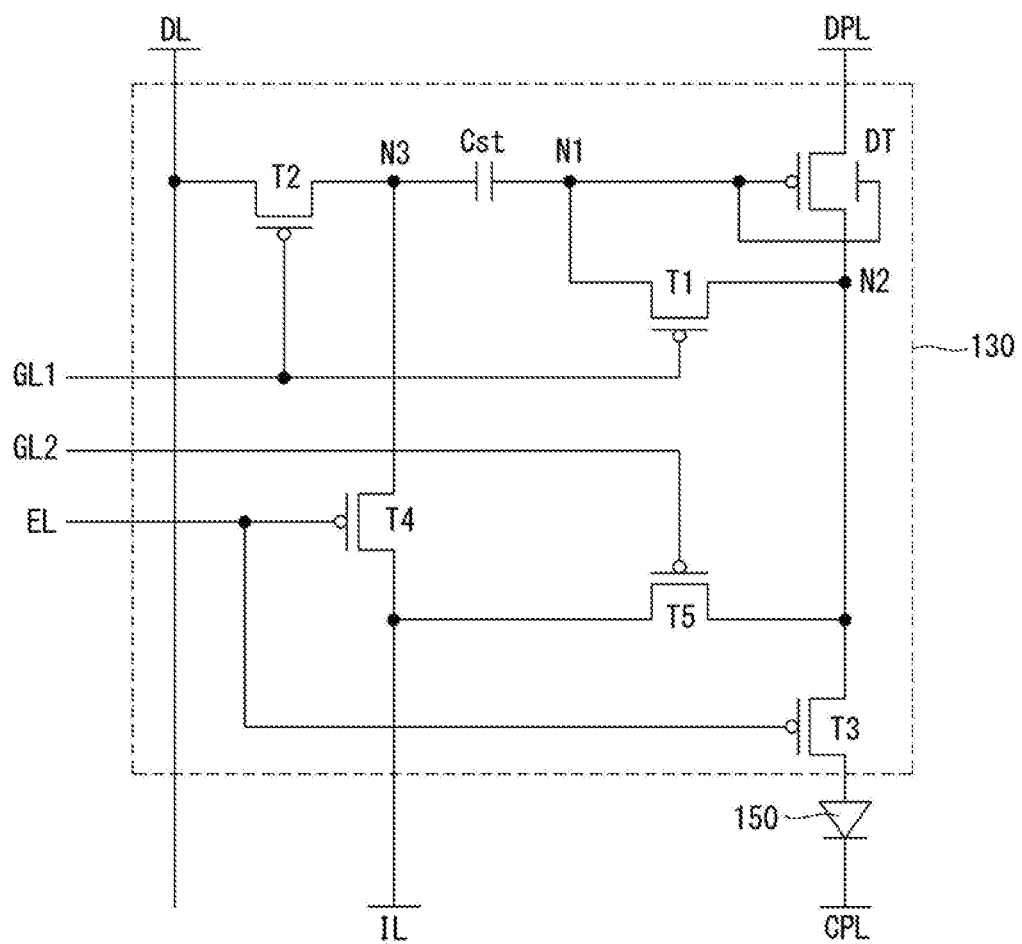
FIG. 2 is a circuit diagram illustrating a pixel driving circuit according to an embodiment of the disclosure.

FIG. 1 is a plan view illustrating a display device according to an embodiment of the disclosure. FIG. 2 is a circuit diagram illustrating a pixel driving circuit according to an embodiment of the disclosure. All components of the display device according to all embodiments of the disclosure are operatively coupled and configured.

Referring to FIGS. 1 and 2, a display panel 100 according to an embodiment of the disclosure includes s substrate 110 having a display area DA in which a plurality of unit pixels UP are disposed and a non-display area NDA.

The unit pixel UP can include a plurality of sub-pixels SP1, SP2, and SP3 on a front surface 110a of the substrate 110. That is, the unit pixel UP can include sub-pixels SP1, SP2 and SP3 that emits red light, green light and blue light, respectively. But the unit pixel UP of the disclosure is not limited thereto. The sub-pixel can further include a sub-pixel emitting white light.

The substrate 110 is an array substrate on which transistors are formed, and includes a plastic material or a glass material.

The substrate 110 according to one example can comprise an opaque or colored polyimide material. In this case, it can further include a back plate coupled to a back surface of the substrate 110 to maintain the substrate 110 in a planar state. The back plate according to one example can include a plastic material, for example, a polyethylene terephthalate material. The substrate 110 according to one example can be a glass substrate. For example, the glass substrate 110 can have a flexible characteristic as a thin glass substrate having a thickness of 100 μm or less.

The substrate 110 can be formed by bonding two or more substrates or by dividing two or more layers.

The non-display area NDA can be defined as an area on the substrate 110 excluding the display area DA, and also can be defined as a bezel area having a relatively narrow width (or size) as compared with the display area.

Each of the plurality of unit pixels UP is disposed in the display area DA. In this case, each of the plurality of unit pixels UP has a predetermined first reference pixel pitch along the X-axis direction and has a predetermined second reference pixel pitch along the Y-axis. Each of the first reference pixel pitch and the second reference pixel pitch can be defined as a distance between the central portions of each of the unit pixels UP adjacent in the X-axis direction or the Y-axis direction.

The distance between the sub-pixels SP1, SP2 and SP3 constituting the unit pixel UP can also be defined as a first reference sub-pixel pitch and a second reference sub-pixel pitch similar to the first reference pixel pitch and the second reference pixel pitches.

The width of the non-display area NDA of the display panel 100 including a LED element 150 can be smaller than a pixel pitch or a sub-pixel pitch. For example, if a tiling display device is implemented with a display panel 100 having a non-display area NDA with a length equal to or smaller than the pixel pitch or the sub-pixel pitch, it is possible to implement a tiling display device having substantially no bezel area because the non-display area NDA is smaller than the pixel pitch or the sub-pixel pitch.

In order to implement a tiling display device or a multi-screen display device in which a bezel area is substantially absent or minimized, the display panel 100 displays that the first reference pixel pitch, the second reference pixel pitch, the first reference sub-pixel pitch, and the second reference sub-pixel pitch can be kept constant in the display area DA. However, it is possible to make the size of the bezel area relatively smaller than the pixel pitch by defining the display area DA as a plurality of zones and making the lengths of the pitches different from each other within each zone, and by making the pixel pitch in the zone adjacent to the non-display area NDA wider than pixel pitch in other zones. In this case, since the display panel 100 having different pixel pitches can cause distortion of the image, image processing is performed by comparing and sampling the pixels adjacent to each other in consideration of the predetermined set pixel pitch, thereby eliminating distortion of the image while reducing the bezel area.

The configuration and driving circuit of the sub-pixels SP1, SP2, and SP3 constituting the unit pixel UP of the display panel 100 will be described with reference to FIG. 2. Pixel drive lines are provided on the front surface 110a of the substrate 110 and supply necessary signals to each of the plurality of sub-pixels SP1, SP2, and SP3. The pixel drive lines according to an embodiment of the disclosure include a gate line, a data line DL, and a power supply line. The gate line includes a first gate line GL1, a second gate line GL2 and an emission line EL. The power supply line includes a driving power supply line DPL, a common power supply line CPL, and an initialization power supply line IL.

The gate lines are provided on the front surface 110a of the substrate 110 and are spaced apart from each other along a vertical axis direction Y of the substrate 110 while being elongated along a horizontal axis direction X of the substrate 110.

The data lines DL are provided on the front surface 110a of the substrate 110 so as to crossing over the gate lines and are elongated along the vertical axis direction Y of the substrate 110 while being spaced apart from each other along the horizontal axis direction X of the substrate 110.

The driving power supply line DPL is provided on the substrate 110 so as to be parallel to the data line DL and can be formed together with the data line DL. Each of the driving power supply lines DPL supplies a pixel driving power supplied from the outside to the adjacent sub-pixels SP1, SP2, and SP3. For example, one driving power supply line DPL can be provided for each of a plurality of unit pixels UP. In this case, at least three sub-pixels SP1, SP2 and SP3 constituting the unit pixel UP share one driving power supply line DPL. The number of driving power supply lines DPL for driving each of the sub-pixels SP1, SP2 and SP3 can be reduced. And also it is possible to increase the aperture ratio of each unit pixel UP or reduce the size of each unit pixel UP by the reduction of the number of the driving power supply lines DPL.

The common power supply line CPL is provided on the substrate 110 so as to be parallel with the gate lines, and can be formed together with the gate lines. The common power supply line CPL supplies a common power supplied from the outside to the sub-pixels SP1, SP2 and SP3 adjacent to each other.

Each of the sub-pixels SP1, SP2 and SP3 is provided in a sub-pixel area defined by the gate line and the data line DL. Each of the sub-pixels SP1, SP2, and SP3 can be defined as a minimum unit area in which actual light is emitted.

At least three sub-pixels SP1, SP2 and SP3 adjacent to each other can constitute one unit pixel UP for implementing colors. For example, one unit pixel UP can include a red sub-pixels SP1, a green sub-pixels SP2, and a blue sub-pixels SP3 adjacent to each other along the horizontal axis direction X, and can further include a white sub-pixel to improve brightness. The arrangement of the sub-pixels shown in the disclosure is in a stripe form, but is not limited thereto.

Each of the plurality of sub pixels SP1, SP2 and SP3 according to an embodiment of the disclosure includes a pixel circuit 130 and a LED element 150.

The pixel circuit 130 is provided in a circuit region defined in each of the sub-pixels SP1, SP2 and SP3, and is connected to the gate line, the data line DL, and the power source line. The pixel circuit 130 controls a current flowing in the LED element 150 according to a data signal provided through the data line DL, based on the pixel driving power supplied through the driving power supply line DPL, and in response to a scan pulse supplied through the gate line.

The pixel circuit 130 according to an embodiment of the disclosure includes a first transistor T1, a second transistor T2, a third transistor T3, a fourth transistor T4, a fifth transistor T5, a driving transistor DT, and a capacitor Cst. The first to fifth transistors T1 through T5 and the driving transistor DT can be realized in a p-type thin film transistor, and thus a response characteristic can be secured. However, the technical idea of the disclosure is not limited thereto. For example, at least one transistor among the first transistor T1 through the fifth transistor T5 and the driving transistor DT is implemented as an n-type thin film transistor having an excellent off-current characteristic, and other transistors can be implemented as the p-type thin film transistor having a good response characteristic.

The LED element 150 is mounted on each of the sub-pixels SP1, SP2 and SP3. The LED element 150 is electrically connected to the pixel circuit 130 and the common power supply line CPL of the corresponding subpixel so that the LED element 150 emits light by current flowing from the driving transistor DT of the pixel circuit 130 to the common power supply line CPL. The LED device 150 according to an embodiment of the disclosure can be an optical device or a light emitting diode chip that emits any one of red light, green light, blue light, and white light. Here, the light emitting diode chip can have a scale of 1 to 100 micrometers, but the disclosure is not limited thereto. The light emitting diode chip can have a size smaller than the size of the remaining light emitting area except the circuit region occupied by the pixel circuit 130 among the subpixel area.

The driving transistor DT is a driving element for adjusting the current flowing through the LED element 150 according to the gate-source voltage of the driving transistor DT. The driving transistor DT includes a gate electrode connected to the first node N1, a source electrode connected to the driving power supply line DPL, and a drain electrode connected to the second node N2. The driving transistor DT can be implemented as a double gate type transistor to provide a high driving current to the LED element 150.

The first transistor T1 is connected between the first node N1 and the second node N2, and is switched according to the first gate signal. The gate electrode of the first transistor T1 is connected to the first gate line GL1 to which the first gate signal is applied. The first transistor T1 makes the driving transistor DT in a diode-connection state by connecting the gate electrode and the drain electrode of the driving transistor DT when the first transistor T1 is turned-on. In this case, the first transistor T1 senses and compensates for the threshold voltage factor of the driving transistor DT.

The second transistor T2 is connected between the data line DL and a third node N3, and is switched in accordance with the first gate signal. The gate electrode of the second transistor T2 is connected to the first gate line GL1. When the second transistor T2 is turned on, the data signal is applied to the third node N3.

The third transistor T3 is connected between the second node N2 and the LED element 150 and is switched according to an emission signal provided through the emission line EL. When the third transistor T3 is turned-on, a current flowing through the driving transistor DT is supplied to the LED element 150. The third transistor T3 controls the LED element 150 having a low emission threshold voltage so that the LED element 150 does not emit light due to the initialization voltage.

The fourth transistor T4 is connected between the third node N3 and the initialization power supply line IL, and is switched in accordance with the emission signal. When the fourth transistor T4 is turned-on, the initialization power supplied through the initialization power supply line IL is supplied to the third node N3 to initialize the voltage of the third node N3.

The fifth transistor T5 is connected between the second node N2 and the initialization power supply line IL and is switched according to the second gate signal provided through the second gate line GL2. When the fifth transistor T5 is turned-on, the initialization power is supplied to the second node N2 to initialize the voltage of the second node N2.

The capacitor Cst is provided in an overlapping region of the first node N1 and the third node N3, and stores a voltage corresponding to the data signal supplied to the gate electrode of the driving transistor DT. The driving transistor DT is turned-on by the voltage stored on the capacitor.

Next, the driving of the pixel circuit 130 will be described. The driving of the pixel circuit 130 of FIG. 2 can be divided into a first initialization period, a second initialization period, a compensation period, a sustain period, and a light emission period. In the first initialization period, since the emission signal and the second gate signal are in the gate-on voltage state, the voltage of the third node N3 is initialized and the LED element 150 maintains the light emitting state. In the second initialization period, since the emission signal is switched to the gate-off voltage, the first gate signal is switched to the gate-on voltage, and the second gate signal maintains the gate-on voltage, the LED element 150 stops emitting light, and a data signal is applied to the third node N3. In the compensation period, since the second gate signal is switched to the gate-off voltage, and the first transistor T1 is turned on, the driving transistor DT is diode-connected to compensate the threshold voltage. In the sustain period, since the first gate signal, the second gate signal, and the emission signal are all in a gate-off voltage state, the voltage applied to the previous period is maintained at each node. In the light emission period, since the emission signal is switched to the gate-on voltage, the LED element 150 emits light by the driving current supplied from the driving transistor DT. In this case, the initialization voltage can be lower than the driving power, and can be higher than the common power. Since the driving current of the pixel circuit 130 is not affected by the driving power source, a uniform image quality can be realized in a high-resolution display device.

The pixel circuit 130 according to an embodiment of the disclosure is not limited to the configurations of the first transistor T1 through the fifth transistor T5, the driving transistor DT, and the capacitor Cst described above. The pixel circuit 130 can further include an auxiliary transistor and/or auxiliary capacitor and so on controlled by a separate emission signal.

Figure 3:
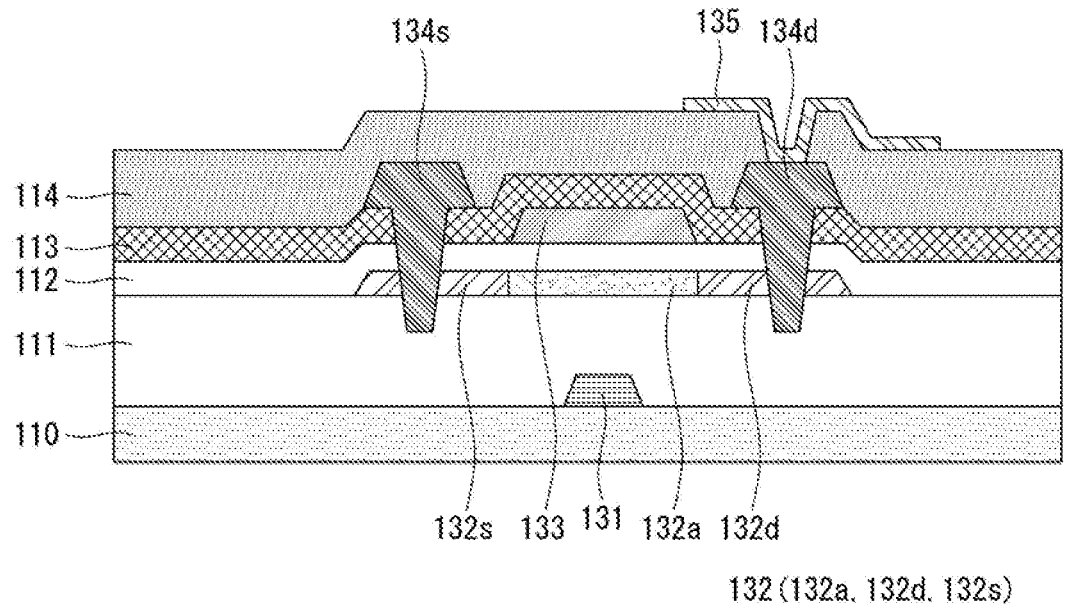
FIG. 3 is a cross-sectional view illustrating a driving element according to an embodiment of the disclosure.

FIG. 3 is a cross-sectional view illustrating a driving element according to an embodiment of the disclosure.

As described in FIG. 2, each of the sub-pixels SP1, SP2 and SP3 of the display panel 100 according to the embodiment of the disclosure includes the pixel circuit 130 and the LED element 150. Among the various components constituting the pixel circuit 130, the driving transistor DT is a driving element that applies a driving current (or a light emitting current) to the LED element 150. Hereinafter, the driving transistor DT will be described.

More specifically, FIG. 3 is a cross-sectional view of a driving transistor DT implemented with a double gate type transistor. The driving transistor DT includes a lower gate electrode 131, an upper gate electrode 133, an active layer 132, a source electrode 134s, and a drain electrode 134d.

The lower gate electrode 131 is formed of the same material on the same layer as the gate line on the substrate 110 and covered with the first insulating layer 111. In this case, the first insulating layer 111 can be referred to as a lower gate insulating layer. The lower gate electrode 131 can be formed of a semiconductor such as silicon or a conductive metal such as one of molybdenum (Mo), aluminum (Al), chromium (Cr), gold (Au), titanium (T1), nickel (N1), neodymium (Nd), and copper (Cu), or two or more alloys thereof, or multilayers thereof. The first insulating layer 111 can be formed of a single layer or a plurality of layers made of an inorganic insulating material, and can be formed of silicon oxide (SiOx), silicon nitride (SiNx), or the like.

The active layer 132 is provided in a predetermined pattern on the first insulating layer 111 so as to overlap with the lower gate electrode 131. The active layer 132 includes a channel region 132a overlapping with the lower gate electrode 131 and on which the carrier moves, a source region 132s to be in contact with a source electrode 134s, and a drain region 132d to be in contact with a drain electrode 134d. The active layer 132 can include a semiconductor material of any one of amorphous silicon, polycrystalline silicon, oxide, and organic material but is not limited thereto.

A second insulating layer 112 is provided on the front surface of the substrate 110 so as to cover the active layer 132 on the substrate 110. The second insulating layer 112 insulates the active layer 132 from an upper gate electrode 133 to be provided on the second insulating layer 112. In this case, the second insulating layer 112 can be referred to as a lower gate insulating layer. The second insulating layer 112 can be a single layer or a plurality of layers made of an inorganic insulating material, and can be formed of silicon oxide (SiOx), silicon nitride (SiNx), or the like.

The upper gate electrode 133 is provided on the second insulating layer 112 in a superposed manner with the channel region 132a of the active layer 132. Also, the upper gate electrode 133 can overlap with the lower gate electrode 131 to enhance the electric field between the gate electrode and the active layer 132. The cross-sectional view of the driving transistor DT according to one embodiment shown in FIG. 3 is a cross-section taken along a longitudinal direction of the active layer 132, that is, the direction in which the carrier moves from the source region 132s to the drain region 132d. The lower gate electrode 131 is formed to be shorter than the upper gate electrode 133 or the channel region 132a of the active layer 132. A detailed description thereof will be described later with reference to FIGS. 4A to 4C.

The third insulating layer 113 is provided on an entire surface of the substrate 110 so as to cover the upper gate electrode 133 on the substrate 110. The third insulating layer 113 insulates the upper gate electrode 133 from the source electrode 134s and the drain electrode 134d to be provided on the third insulating layer 113. The third insulating layer 113 is formed of one of an inorganic insulating material including silicon oxide (SiOx), silicon nitride (SiNx) and so on, and an organic insulating material including photo acryl, benzocyclobutene and so on.

The source electrode 134s can be in contact with the source region 132s of the active layer 132 and can be formed of the same material on the same layer as the data line DL and the driving power source line DPL.

The drain electrode 134d is spaced apart from the source electrode 134s and contacts the drain region 132d of the active layer 132 and is formed of the same material on the same layer as the source electrode 134s.

The source electrode 134s and the drain electrode 134d can be formed of a semiconductor such as silicon or a conductive metal such as one of molybdenum (Mo), aluminum (Al), chromium (Cr), gold (Au), Titanium (T1), nickel (N1), neodymium (Nd), and copper (Cu) or two or more alloys thereof or multilayers thereof.

There is a method in which the source electrode 134s and the drain electrode 134d are brought into contact with the upper surface of the active layer 132 among the methods of bringing the source electrode 134s and the drain electrode 134d into contact with the active layer 132. However, this method has a problem that it is difficult to align a corresponding electrode to a target area. Accordingly, the source electrode 134s and the drain electrode 134d do not contact the upper surface of the source region 132s and the drain region 132d, but contact a side surface of the source region 132s and the drain region 132d, respectively.

The insulating layers between the lower gate electrode 131, the active layer 132, the upper gate electrode 133, the source electrode 134s, and the drain electrode 134d and between the electrodes constitute one thin film transistor. The performance of a thin film transistor depends on the design value of the components. One of factors that determine the performance of a thin film transistor is a S-factor (subthreshold slope). The S-factor is a value indicating how fast the voltage can be charged to a pixel. The S-factor represents a slope in on-off period in which the driving current increases sharply beyond a threshold voltage in a driving current graph according to the gate voltage. As the size of the driving element becomes smaller as the display panel becomes higher in resolution, the maximum value of the current flowing in one sub-pixel becomes smaller. As a result, the width of the data voltage that can be used for expressing a gradation is reduced together, so that it is difficult to express the gradation. Therefore, if the slope of the driving current graph according to the gate voltage is decreased by increasing the S-factor, the width of the data voltage is increased, so that more subdivided gradations can be expressed.

In an electroluminescence display panel using an organic light emitting element or an inorganic light emitting element, the larger the S-factor, the better the performance of the thin film transistor. Particularly, in the case of a display panel using a micro-LED as the light emitting element, the S-factor must satisfy a minimum of 0.3 to enable gradation representation to be sufficiently subdivided. The S-factor is a value determined according to the capacitance between the lower gate electrode 131 and the active layer 132 and the capacitance between the active layer 132 and the upper gate electrode 133. The value of the S-factor can be obtained by appropriately adjusting the thickness of the first and second insulating layers 111 and 112.

The fourth insulating layer 114 is provided on the entire surface of the substrate 110 so as to cover the pixel circuit 130 including the source electrode 134s and the drain electrode 134d. The fourth insulating layer 114 can provide a flat surface while protecting the pixel circuit 130. The fourth insulating layer 114 according to an embodiment of the disclosure can include an inorganic insulating material such as a silicon oxide film (SiOx) and a silicon nitride film (SiNx), or an organic insulating material such as benzocyclobutene or photo acryl. The fourth insulating layer 114 can independently have a protective layer for protecting the pixel circuit 130 and a flat layer for flattening step coverage of the pixel circuit 130.

The LED element 150 is electrically connected to the pixel circuit 130 and the common power supply line CPL to emit light by the current flowing from the pixel circuit 130 to the common power line CPL. The pixel electrode 135 is provided on the fourth insulating layer 114 as an anode electrode of the LED element 150 connected to the drain electrode 134d of the driving transistor DT. FIG. 3 is a sectional view of a driving element according to an embodiment of the disclosure in which there is no third transistor T3 for controlling the light emission of the LED device 150 between the LED element 150 and the driving transistor DT. If it is applied to the circuit diagram of FIG. 2, the pixel electrode 135 can be provided in contact with the drain electrode of the third transistor T3. The pixel electrode 135 can be formed of a transparent conductive material when the display panel 100 is a top emission type. However, the pixel electrode 135 can be formed of a reflective conductive material when the display panel 100 is a bottom emission type. The transparent conductive material can be indium tin oxide (ITO), indium zinc oxide (IZO), or the like, but is not limited thereto. The light reflecting conductive material can be Al, Ag, Au, Pt, or Cu, but is not limited thereto. The pixel electrode 135 made of a light reflective conductive material can be a single layer including a light reflecting conductive material or a multi-layered structure in which a single layer is stacked.

Figure 4A:
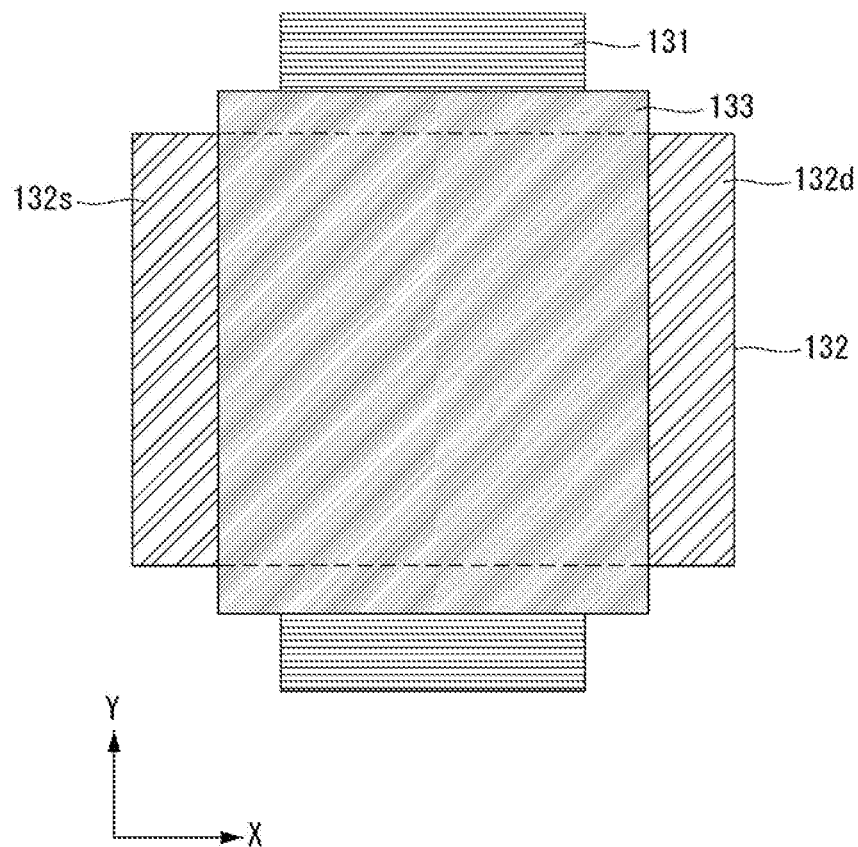
FIG. 4A is a plan view schematically illustrating a thin film transistor according to an embodiment of the disclosure.
Figure 4B:
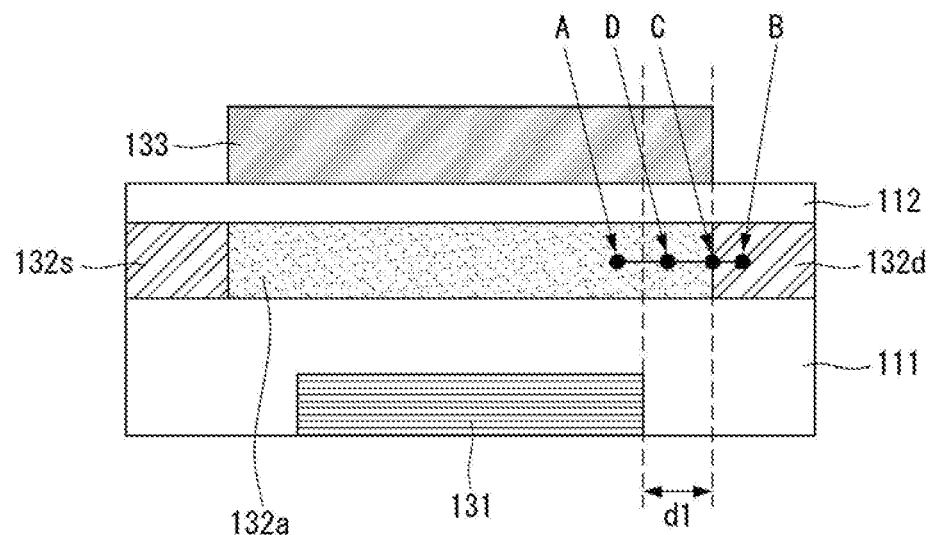
FIG. 4B is a cross-sectional view taken along X-axis of FIG. 4A.
Figure 4B:
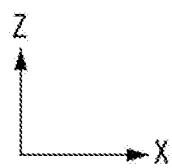
Figure 4C:
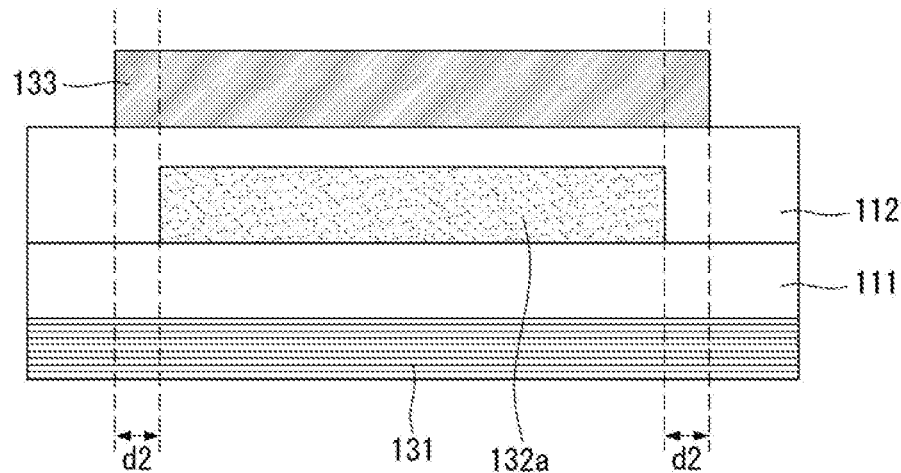
FIG. 4C is a cross-sectional view taken along Y-axis of FIG. 4A.
Figure 4C:
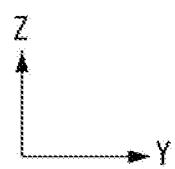

FIG. 4A is a plan view schematically illustrating a thin film transistor according to an embodiment of the disclosure. FIG. 4B is a cross-sectional view taken along X-axis of FIG. 4A. FIG. 4C is a cross-sectional view taken along Y-axis of FIG. 4A. Specifically, the thin film transistor of FIGS. 4A to 4C is applied to or can be used as the driving transistor DT.

More specifically, FIG. 4A is a plan view in which the lower gate electrode 131, the active layer 132, and the upper gate electrode 133 are overlapped with each other. The channel region 132a of the active layer 132 is disposed under the upper gate electrode 133 and is not seen in the plan view. The source region 132s and the drain region 132d of the active layer 132 exposed at left and right of the upper gate electrode 133 are shown. The length of the upper gate electrode 133 corresponds to the length of the channel region 132a of the active layer 132, and the width of the upper gate electrode 133 is larger than the width of the channel region 132a of the active layer 132. In this case, the length can be a numerical value in the X-axis direction and can be a numerical value in the direction in which the carrier moves on the channel region 132a. For example, the length can mean a numerical value in a direction connecting the source region 132s to the drain region 132d. The width can be a numerical value in the Y axis direction and can be a numerical value in a direction perpendicular to the direction in which the carrier moves in the channel region 132a. For example, the width can be a numerical value in the direction perpendicular to the direction connecting the source region 132s to the drain region 132d.

The width of the channel region 132a of the driving transistor DT according to an embodiment of the disclosure is larger than the length of the channel region 132a. The width of the upper gate electrode 133 covering the channel region 132a is larger than the length of the upper gate electrode 133. The driving transistor DT thus can increase the magnitude of the driving current supplied to the LED element 150.

As described above, the characteristics of the driving element in which the width of the channel region 132a of the active layer 132 is longer than the length thereof, are lower than that of the driving element in which the width of the channel region 132a is shorter than the length thereof. When the width of the channel region 132a is longer than the length of the channel region 132a, factors that degrade characteristics of the driving element such as a hump and a DIBL are generated in the IV curve of the transistor. Also, there are other problems that the driving current is not saturated in a saturation region but increases when measuring curve of the drive current. The LED element 150 has to maintain a stable current value as a current device. However it is not easy to maintain a stable luminance in the case of using the driving element in which the width of the channel region 132a is greater than the length the driving element. Therefore, the lower gate electrode 131 is provided below the active layer 132 in order to improve the characteristics of the driving element while providing a high driving current.

Referring to FIGS. 4A and 4B, the lower gate electrode 131 overlaps with the channel region 132a of the active layer 132, and the length of the lower gate electrode 131 is shorter than the length of the channel region 132a of the active layer 132. The edge of the lower gate electrode 131 closest to the drain region 132d overlaps with the channel region 132a, and is positioned inside by a first distance d1 from a boundary portion of the channel region 132a and the drain region 132d of the active layer 132. The channel of the region A is affected by both of the upper gate electrode 133 and the lower gate electrode 131 to form an electric field, and the channel of the region D is affected by only the upper gate electrode 133. Therefore, the electric field of the region D is formed to be weaker than the electric field of the region A.

Figure 7:
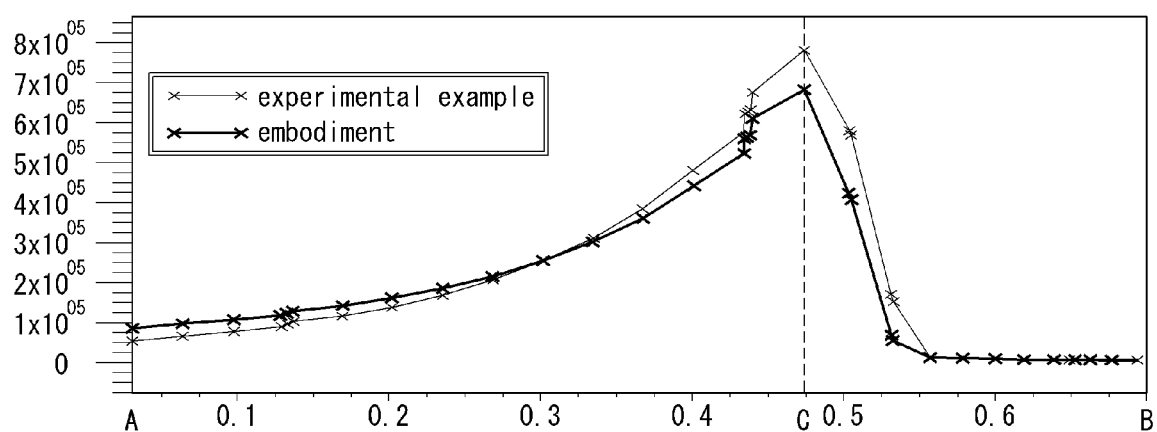
FIG. 7 is a graph showing an electric field of a thin film transistor according to an embodiment of the disclosure.

For example, when the lower gate electrode having a length equal to the length of the channel region 132a of the active layer 132 is disposed in the driving element having the channel region 132a having a width larger than the length thereof, the electric field in the region C adjacent to the drain region 132d can rise sharply. Referring to FIG. 7, FIG. 7 is a graph showing electric field for regions in the active layer 132. Specifically, it shows the electric field in the region A, the region B. and the region C which is the boundary between the region D and the region B of the active layer 132. The horizontal axis of the graph is micron indicating a length, and the vertical axis is V/cm indicating unit of electric field. In the experimental example shown in the graph, the lower gate electrode having the same length as the channel region 132a of the active layer 132 is disposed. In this case, the upper gate electrode 133 as well as the lower gate electrode 131 is provided in the region A and the region D of the active layer 132. The embodiment shown in the graph is a case where the lower gate electrode having a length shorter than the length of the channel region 132a of the active layer 132 is disposed in the thin film transistor according to the embodiment of the disclosure. In this case, the upper gate electrode 133 and the lower gate electrode 131 are provided in the region A of the active layer 132, and only the upper gate electrode 133 is provided in the region D. As shown in FIG. 7, it can be confirmed that the electric field is concentrated in the region C, which is the end portion of the channel region 132a adjacent to the drain region 132d, and the electric field concentration phenomenon is alleviated in the embodiment as compared with the experimental example.

Figure 6A:
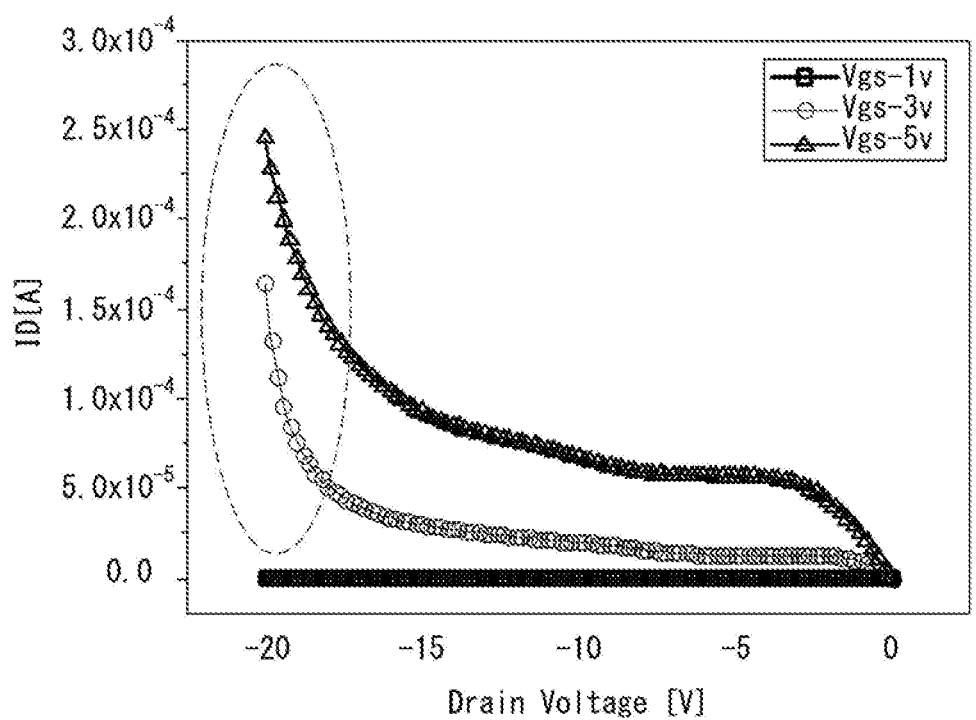
FIG. 6A is a graph illustrating a driving current of a thin film transistor according to an experimental example.
Figure 6B:
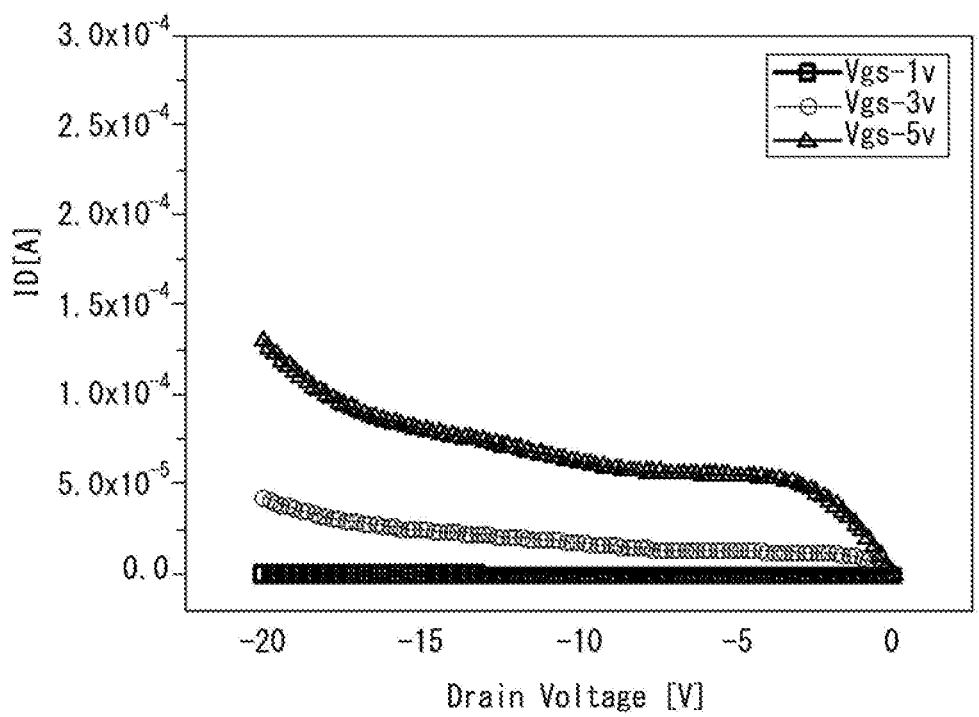
FIG. 6B is a graph illustrating a driving current of a thin film transistor according to an embodiment of the disclosure.

Referring to FIGS. 6A and 6B, FIG. 6A is a graph illustrating a driving current of a thin film transistor according to an experimental example and FIG. 6B is a graph illustrating a driving current of a thin film transistor according to an embodiment of the disclosure. In both FIGS. 6A and 6B, the driving current tends to increase as the drain current increases. However, in the experimental example, it is confirmed that a kink effect in which the driving current rapidly increases occurs. In this case, the kink effect appears in the portion indicated by the dotted line in FIG. 6A. The kink effect occurs due to impact ionization in the drain junction (in this case, the region C) of the channel because a large drain electric field is applied when the driving element operates in a region where the kink effect is generated. The kink effect should be improved because the kink effect can cause unexpected voltage characteristics in the driver element or deteriorate the electrical characteristics of the thin film transistor.

In contrast, in the embodiment of the present disclosure, not only can the kink effect be improved, but also a high drive current can be maintained by forming the length of the lower gate electrode 131 of the driving element shorter than the length of the channel region 132a of the active layer 132. Specifically, as shown in FIG. 6B, the length of the lower gate electrode 131 should be shorter than the length of the upper gate electrode 133 in order to reduce the kinking effect shown in FIG. 6A while the driving element generates a high driving current. However, the length of the lower gate electrode 131 should be at least half the length of the upper gate electrode 133 in order to maintain the structure of the double gate type transistor and generate a high driving current. Since the kink effect occurs in the drain junction portion of the channel, it is also possible to define the edge of the lower gate electrode 131 adjacent to the drain region 132d. That is, it is possible to reduce occurrence of kink, hump, or DIBL by positioning the edge of the lower gate electrode 131 adjacent to the drain region 132d inside the channel region 132a. In this case, the edge of the lower gate electrode 131 close to the source region 132s can be located at the boundary portion between the source region 132s and the channel region 132a or can be located inside the channel region 132a.

FIG. 4C is a cross sectional view in the width direction of the channel region 132a of the active layer 132. Referring to FIGS. 4A and 4C, the upper gate electrode 133 fully covers the channel region 132a of the active layer 132, thereby allowing the carriers to move through the channel region 132a. In this case, the width of the upper gate electrode 133 can be equal to or larger than the width of the channel region 132a. For ease of alignment, the width of the upper gate electrode 133 can be twice larger the second length d2 than the width of the channel region 132a. The width of the lower gate electrode 131 is greater than the width of the channel region 132a so that no step coverage is formed in the channel region 132a and the characteristics of the thin film transistor are not degraded. Specifically, the width of the lower gate electrode 131 can be larger than the width of the channel region 132a by twice the second length d2 in consideration of the alignment of the active layer 132 and the lower gate electrode 131. Also, the width of the lower gate electrode 131 can be greater than the width of the upper gate electrode 133 in consideration of alignment between the upper gate electrode 133 and the lower gate electrode 131.

The thin film transistor according to an embodiment of the disclosure can generate a stable high driving current without losing characteristics of the driving element by applying an electrode-specific structure capable of adjusting an electric field in the channel region. In this case, the electrode-specific structure is a structure utilizing the upper and lower gate electrodes, in which the upper gate electrode covers the channel region, and the edge of the lower gate electrode adjacent to the drain region is disposed inside the boundary between the channel region and the drain region and overlaps with the channel region.

FIGS. 5A to 5H are cross-sectional views illustrating a method of manufacturing a thin film transistor according to an embodiment of the disclosure, and are cross-sectional views taken along the X-axis similar to FIG. 4B.

Figure 5A:
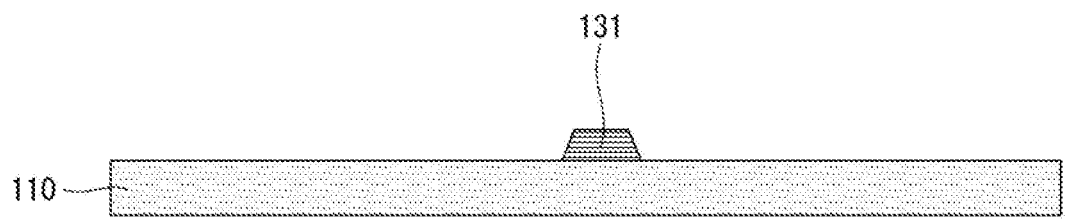
FIGS. 5A to 5H are cross-sectional views illustrating a method of manufacturing a thin film transistor according to an embodiment of the disclosure.

Referring to FIG. 5A, a gate metal layer is formed on a substrate 110, and then is patterned to form a lower gate electrode 131.

Figure 5B:
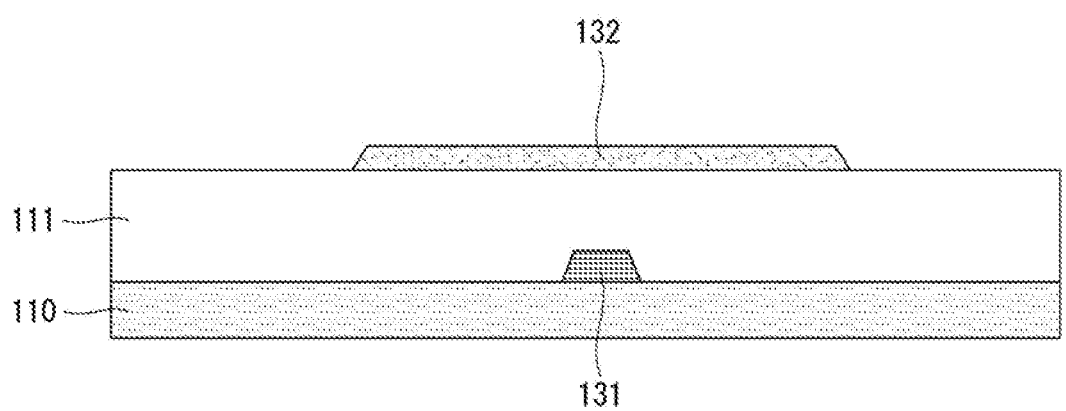

Referring to FIG. 5B, a first insulating layer 111 is formed on the entire surface of the substrate 110 so as to cover the lower gate electrode 131. Next, an amorphous silicon (a-Si: H) is deposited on the first insulating layer 111 by a plasma chemical vapor deposition method to form an amorphous silicon layer, crystallize the amorphous silicon layer, and pattern it to form an active layer 132 in a region overlapping with the lower gate electrode 131. In this case, the length of the active layer 132 is longer than the length of the lower gate electrode 131.

The first insulating layer 111 serves to prevent the active layer 132 from being contaminated by impurities contained in the substrate 110 in the process of depositing and crystallizing the amorphous silicon by the plasma chemical vapor deposition method.

Methods for crystallizing the amorphous silicon can use any one selected among an excimer laser annealing (ELA), a solid phase crystallization (SPC), a sequential lateral solidification (SLS), a metal induced crystallization (MIC), a metal induced lateral crystallization (MILC), and alternative magnetic lateral crystallization (AMLC). However, the disclosure is not limited thereto.

Figure 5C:
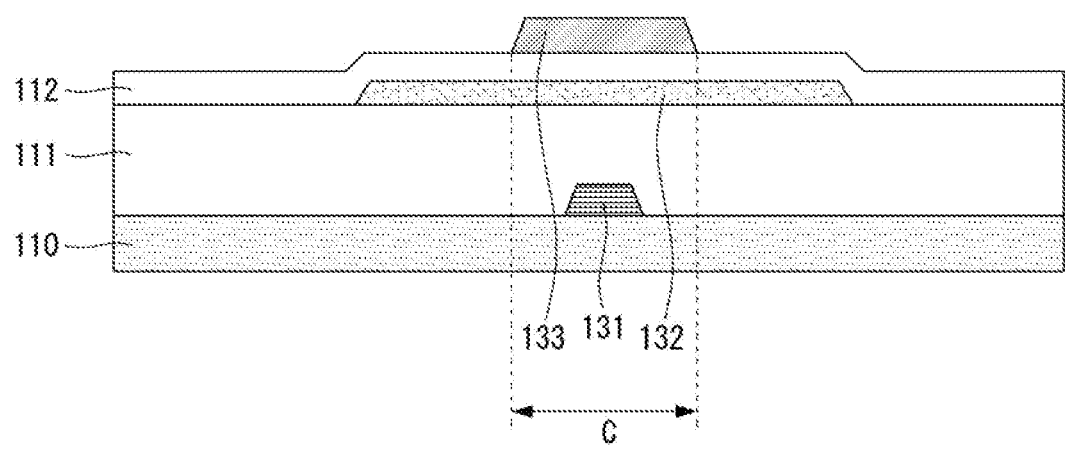

Referring to FIG. 5C, a second insulating layer 112 is formed on the active layer 132. Next, an upper gate metal layer is formed on the second insulating layer 112, and patterned to form a gate line to which a scan signal is applied and a gate electrode extended from the gate line and to be overlapped with a region C where a channel of the active layer 132 is formed. In this case, the gate line can be formed on the same layer as the upper gate electrode or on the same layer as the lower gate electrode.

Figure 5D:
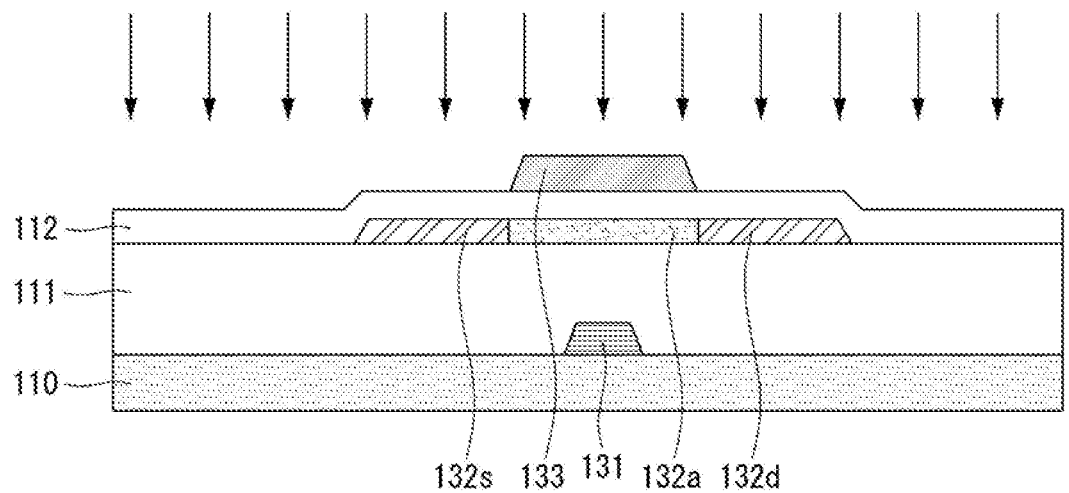

Referring to FIG. 5D, the active layer 132 is doped with a large amount of n-type or p-type ions using the upper gate electrode 133 as an ion stopper. Through the doping process, a channel region 132a, a source region 132s and a drain region 132d are formed. The channel region 132a overlaps with the upper gate electrode 133 and is a region where no impurity is implanted. The source region 132s and the drain region 132d are regions where the large amounts of n-type or p-type ions are doped. Therefore, the length of the upper gate electrode 133 is formed to be equal to the length of the channel region 132a of the active layer 132.

Figure 5E:
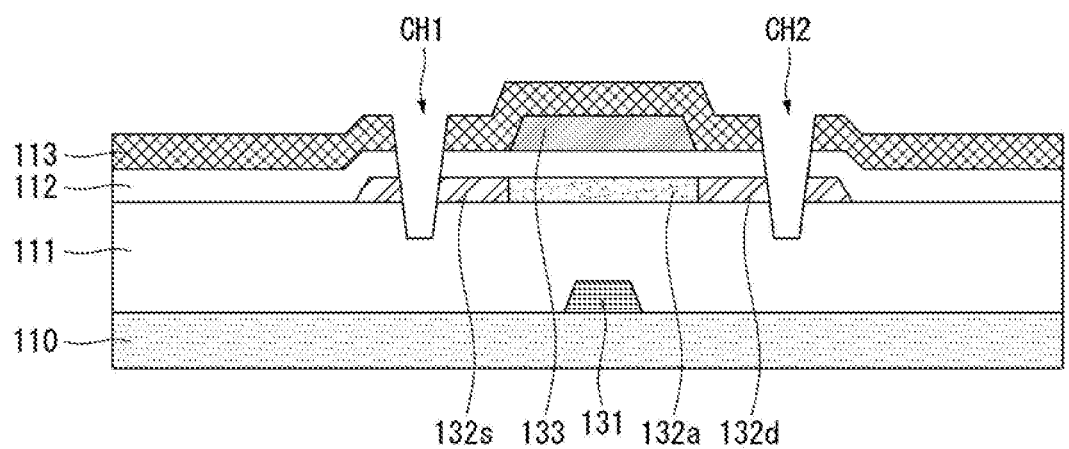

Referring to FIG. 5E, a third insulating layer 113 is formed to cover an entire upper surface of the upper gate electrode 133. A photoresist is coated on the substrate 110 on which the third insulating layer 113 is formed to form a photosensitive layer, and a mask consisting of light shielding portions and light transmissive portions is aligned with the photosensitive layer at an upper side of the photosensitive layer spaced apart from the mask. The light shielding portions completely block the light, and the light transmitting portions transmit the light so that the photosensitive layer exposed to the light can be chemically changed to be completely exposed. In this case, the light transmissive portions are located corresponding to a part of each of the source region 132s and the drain region 132d, and the region excluding the light transmissive portions allows the light shielding portions to be located. The photosensitive layer corresponding to the parts of the source region 132s and the drain region 132d is all removed by the exposure process using a stepper disposed toward the substrate 110 at an upper side of the photosensitive layer spaced apart from the mask. A plurality of photosensitive patterns having no thickness change are formed in remaining regions excepting the parts of the source region 132s and the drain region 132d. The third insulating film 113 corresponding to the parts of the source region 132s and the drain region 132d is exposed to the outside through the above-described exposure process.

The third insulating film 113 exposed corresponding to the part of the source region 132s and the drain region 132d, the second insulating film 112 and the active layer 132 under the third insulating film 113 are exposed using the plurality of photosensitive patterns as a mask, and are patterned at a same time using a plasma dry etching equipment. In this case, the third insulating film 113, the second insulating film 112 and the active layer 132 are patterned at a same time to form a first contact hole CH1 and a second contact hole CH2 formed by pattering the third insulating film 113, the second insulating film 112, and the active layer 132 at a same time using a reaction gas that reacts well with the materials constituting the third insulating film 113 the second insulating film 112, and the active layer 132. The first contact hole CH1 corresponds to the source region 132s of the doped active layer 132, and the second contact hole CH2 corresponds to the drain region 132d of the doped active layer 132. Next, a portion of the first insulating layer 111 is removed by over-etching the first insulating layer 111 under the doped source and drain regions.

Through the above-described process, side surfaces of the source region 132s and the drain region 132d are exposed by the first contact hole CH1 and the second contact hole CH2.

Figure 5F:
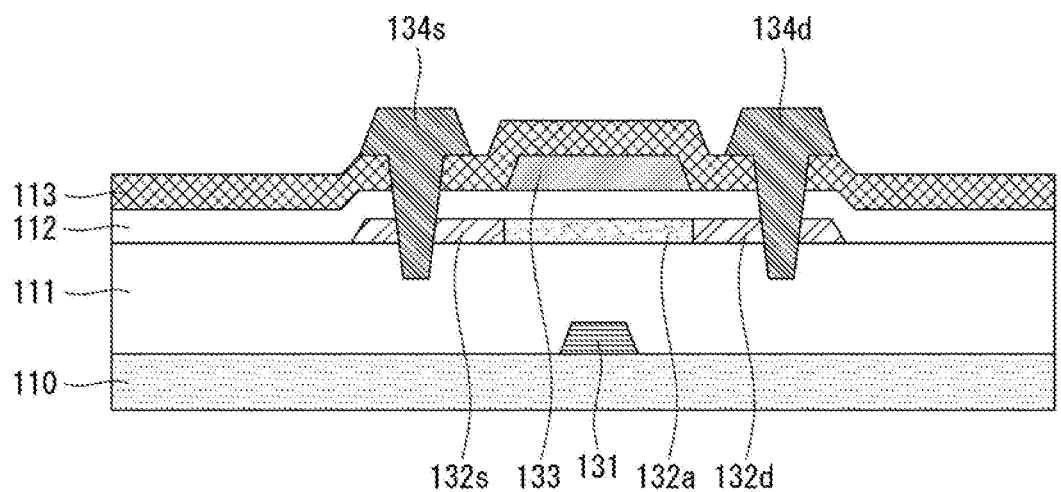

Referring to FIG. 5F, a source and drain metal layer selected from one of a group of conductive materials including titanium alloy (TiN), indium-tin-oxide (ITO) and indium-zinc-oxide (IZO) is deposited on the third insulating film 113 to fill the first and second contact holes CH1 and CH2. A data line, a source electrode 134s and a drain electrode 134d are formed by patterning the source and drain metal layer. The data line defines a sub-pixel region together with a gate line. The source electrode 134s is extended from the data line and in contact with the source region 132s of the active layer 132 through the first contact hole CH1. The drain electrode 134d is spaced apart from the source electrode 134s and in contact with the drain region 132d of the active layer 132 through the second contact hole CH2.

In order to form the source electrode 134s and the drain electrode 134d on the upper side of the source region 132s and the drain region 132d, a precise aligning operation is required. Therefore, if the alignment is not correct, there can be contact failures between the source electrode 134s and the source electrode 132s and between the drain electrode 134d and the drain region 132d. Therefore, when the source electrode 134s and the drain electrode 134d are formed on the side surfaces of the source region 132s and the drain region 132d as described above, it is possible to increase a process margin for the alignment and to reduce the byproducts that can occur in the etching process as compared with the case that the source electrode 134s and the drain electrode 134d are formed on upper surfaces of the source region 132s and the drain region 132d. As a result, the contact defect can be reduced and a simultaneous etching can be performed, thereby improving process yield.

Figure 5G:
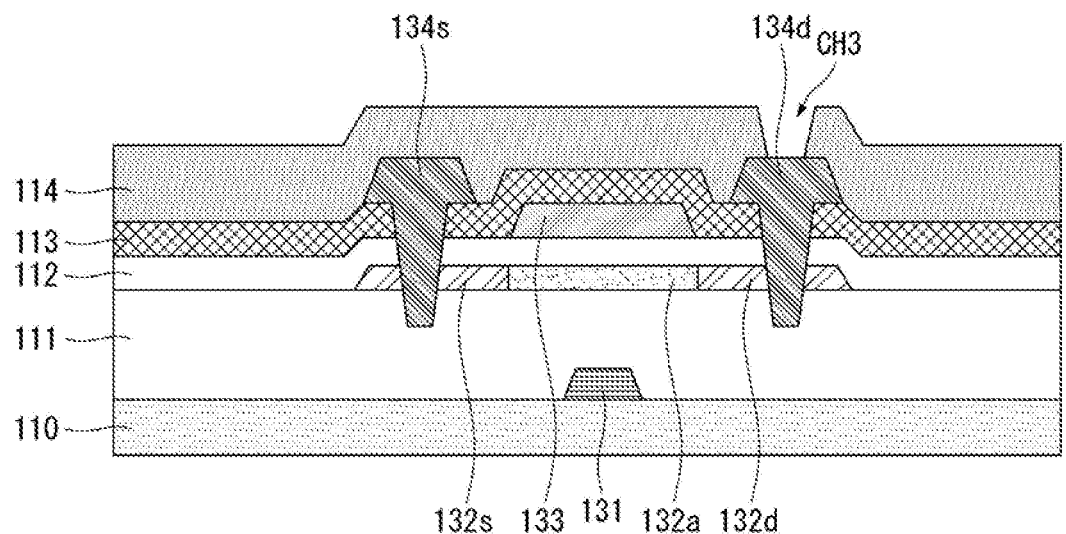

Referring to FIG. 5G, a fourth insulating layer including a third contact hole CH3 exposing the drain electrode 134d is formed on the substrate 110 on which the source electrode 134s and the drain electrode 134d are formed.

Figure 5H:
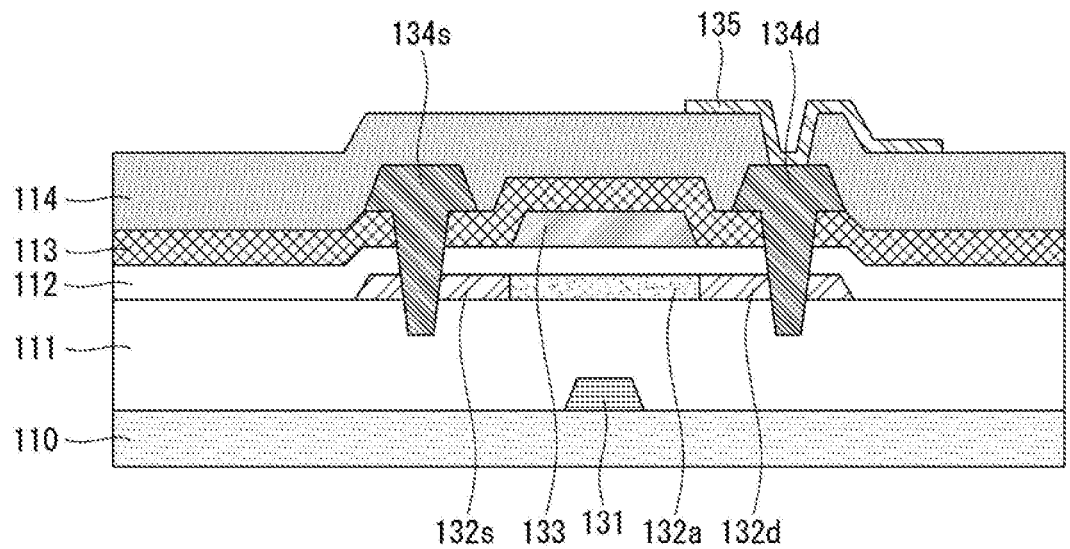

Referring to FIG. 5H, a pixel electrode 135 which is in contact with the drain electrode 134d through the third contact hole CH3 is formed on the fourth insulating layer 114 in correspondence with the sub pixel region.

The manufacturing method of the thin film transistor according to one embodiment of the disclosure has been described above.

In a display panel according to one embodiment of the disclosure, the display panel includes an active layer having a source region, a drain region and a channel region on a substrate, a source electrode contacted with the source region, a drain electrode contacted with the drain region, an upper gate electrode above the active layer, and a lower gate electrode below the active layer. In this case, an edge of the lower gate electrode closest to the drain region overlaps with the channel region, and the source region and the drain region do not overlap with the upper gate electrode. Therefore, the driving element constituting the display panel can generate a high driving current without deteriorating the characteristics thereof, thereby stably maintaining the luminance of the display panel.

According to another feature of the disclosure, a length of the lower gate electrode in a direction connecting the source region to the drain region can be shorter than a length of the upper gate electrode.

According to another feature of the disclosure, a carrier can be moved through the channel region when a voltage is applied to the source electrode and the drain electrode. Also, a length of the upper gate electrode in a direction in which the carrier moves in the channel region can be shorter than a width of the upper gate electrode, the width being a direction perpendicular to a direction in which the carrier moves.

According to another feature of the disclosure, the upper gate electrode can overlap with the channel region, and the size of the upper gate electrode can be larger than the channel region.

According to another feature of the disclosure, the display panel further can comprise a first insulating layer between the lower gate electrode and the active layer; and a second insulating layer between the active layer and the upper gate electrode. The source electrode and the drain electrode can pass through the second insulating layer and the active layer, and be contacted with the first insulating layer.

According to another feature of the disclosure, a thin film transistor can include the active layer, the source electrode, the drain electrode, the upper gate electrode, and the lower gate electrode. Also, the display panel further can comprise a light emission element on the thin film transistor, the light emission element including a micro light emitting diode.

According to another feature of the disclosure, the thin film transistor can have a S-factor of 0.3 or more.

In a thin film transistor according to another embodiment of the disclosure, the thin film transistor comprises an active layer including a source region, a drain region and a channel region, an upper gate electrode above the active layer, and a lower gate electrode below the active layer. In this case, the length of the lower gate electrode is shorter than the length of the upper gate electrode, and the source region and the drain region do not overlap with the upper gate electrode. Therefore, the thin film transistor can improve the characteristics of the thin film transistor while generating a high driving current.

According to another feature of the disclosure, a length of each of the lower gate electrode and the upper gate electrode can be a length in a direction connecting the source region to the drain region.

According to another feature of the disclosure, the length of the lower gate electrode can be equal to or larger than half of the length of the upper gate electrode.

According to another feature of the disclosure, the upper gate electrode can completely cover the channel region of the active layer.

According to another feature of the disclosure, the source region and the drain region of the active layer can be doped.

According to another feature of the disclosure, a width of the channel region can be larger than a length of the channel region.

According to another feature of the disclosure, a width of the lower gate electrode can be equal to or wider than a width of the active layer.

Although embodiments have been described in detail with reference to the accompanying drawings, the disclosure is not necessarily limited to these embodiments, and various modifications can be made without departing from the technical thoughts of the disclosure. Accordingly, the embodiments disclosed in the disclosure are intended to describe rather than limit the scope of the disclosure. Therefore, it should be understood that the above-described embodiments are illustrative in all aspects and not restrictive. The scope of protection of the disclosure should be construed according to the claims, and all technical thoughts within the scope of equivalents should be interpreted as being included in the scope of the disclosure.

What is claimed is:

1. A display panel comprising:
   an active layer including a source region, a drain region, and a channel on a substrate;
   a source electrode and a drain electrode connected to the source region and the drain region, respectively;
   an upper gate electrode above the active layer;
   a lower gate electrode below the active layer;
   a first insulating layer between the lower gate electrode and the active layer; and
   a second insulating layer between the active layer and the upper gate electrode,
   wherein an edge of the lower gate electrode closest to the drain region overlaps the channel region,
   wherein the source region and the drain region do not overlap with the upper gate electrode, and
   wherein the source electrode and the drain electrode pass through the second insulating layer and the active layer, and are contacted with the first insulating layer.

2. The display panel of claim 1, wherein a length of the lower gate electrode in a direction connecting the source region to the drain region is shorter than a length of the upper gate electrode.

3. The display panel of claim 1, wherein a carrier is moved through the channel region when a voltage is applied to the source electrode and the drain electrode, and
wherein a length of the upper gate electrode in a direction in which the carrier moves in the channel region is shorter than a width of the upper gate electrode, the width being in a direction perpendicular to a direction in which the carrier moves.

4. The display panel of claim 1, wherein the upper gate electrode overlaps with the channel region, and is larger than the channel region.

5. The display panel of claim 1, wherein a thin film transistor includes the active layer, the source electrode, the drain electrode, the upper gate electrode, and the lower gate electrode, and the display panel further comprises:
a light emission element on the thin film transistor, the light emission element including a micro light emitting diode.

6. The display panel of claim 5, wherein the thin film transistor has a S-factor of 0.3 or more.

7. A thin film transistor comprising:
an active layer including a source region, a drain region and a channel region;
an upper gate electrode above the active layer; and
a lower gate electrode below the active layer,
wherein a length of the lower gate electrode is shorter than a length of the upper gate electrode, and the source region and the drain region do not overlap with the upper gate electrode, and
wherein the length of the lower gate electrode is equal to or larger than a half of the length of the upper gate electrode.

8. The thin film transistor of claim 7, wherein the length of each of the lower gate electrode and the upper gate electrode is a length in a direction connecting the source region to the drain region.

9. The thin film transistor of claim 7, wherein the upper gate electrode completely covers the channel region of the active layer.

10. The thin film transistor of claim 7, wherein the source region and the drain region of the active layer are doped.

11. The thin film transistor of claim 7, wherein a width of the channel region is larger than a length of the channel region.

12. The thin film transistor of claim 7, wherein a width of the lower gate electrode is equal to or wider than a width of the active layer.

* * * * *